(12) United States Patent
Nielsen et al.

(10) Patent No.: US 11,959,988 B2
(45) Date of Patent: Apr. 16, 2024

(54) ITERATIVE RECONSTRUCTION OF GRADIENT ECHO MAGNETIC RESONANCE IMAGES

(71) Applicant: KONINKLIJKE PHILIPS N.V., Eindhoven (NL)

(72) Inventors: Tim Nielsen, Hamburg (DE); Jan Jakob Meineke, Hamburg (DE)

(73) Assignee: Koninklijke Philips N.V., Eindhoven (NL)

( * ) Notice: Subject to any disclaimer, the term of this patent is extended or adjusted under 35 U.S.C. 154(b) by 64 days.

(21) Appl. No.: 17/796,685

(22) PCT Filed: Feb. 3, 2021

(86) PCT No.: PCT/EP2021/052483
§ 371 (c)(1),
(2) Date: Aug. 1, 2022

(87) PCT Pub. No.: WO2021/165039
PCT Pub. Date: Aug. 26, 2021

(65) Prior Publication Data
US 2023/0056449 A1    Feb. 23, 2023

Related U.S. Application Data

(60) Provisional application No. 62/984,323, filed on Mar. 3, 2020.

(30) Foreign Application Priority Data

Feb. 17, 2020   (EP) .................................... 20157618

(51) Int. Cl.
*G01R 33/56*    (2006.01)
*G01R 33/561*   (2006.01)

(52) U.S. Cl.
CPC ...... *G01R 33/5608* (2013.01); *G01R 33/5611* (2013.01)

(58) Field of Classification Search
CPC ............ G01R 33/5608; G01R 33/5611; G01R 33/4828; G01R 33/50; G01R 33/56545; G01R 33/56563
See application file for complete search history.

(56) References Cited

U.S. PATENT DOCUMENTS

| | | |
|---|---|---|
| 5,539,316 A | 7/1996 | Sukumar |
| 2016/0131729 A1* | 5/2016 | Kang ............... G01R 33/50 324/309 |
| 2019/0212406 A1 | 7/2019 | Meineke et al. |

OTHER PUBLICATIONS

Meineke et al "Data Consistency Driven Determination of B0-Fluctuations in Gradient Ehco MRI" Magnetic Resonance in Med. vol. 81, No. 5 Dec. 4, 2018 p. 3046-3055.
(Continued)

*Primary Examiner* — G. M. A Hyder

(57) ABSTRACT

Disclosed herein is a medical system (100, 300). The execution of machine executable instructions (120) causes a processor (104) to: receive (200) measured gradient echo k-space data (122); receive (202) an off-resonance phase map (124); reconstruct (204) an initial image (126) from the measured gradient echo k-space data; calculate (206) an upsampled phase map (128) from the off-resonance phase map; calculate (208) an upsampled image (130) from the initial image; calculating (210) a modulated image (132) by modulating the upsampled image with the upsampled phase map; calculate (212) a corrected image (134) comprising iteratively. The iterative calculation comprises: calculating (214) updated k-space data by applying a data consistency algorithm (138) to a k-space representation of the modulated image and the measured gradient echo k-space data and calculating (216) an updated image (142) from the updated
(Continued)

k-space data. Calculation of the updated image comprises demodulation by the upsampled phase map and applying a smoothing algorithm.

15 Claims, 8 Drawing Sheets

(56) References Cited

OTHER PUBLICATIONS

Sutton et al "Fast, Iterative Image Reconstruction for MRI in the Presence of Field Inhomogeneties" IEEE Transactions On Medical Imaging, vol. 22, No. 2 Feb. 1, 2003 p. 178-188.

Lu et al "Water Fat Seperation With Bipolar Multiecho Sequences" Magnetic Resonance in Med. vol. 60, No. 1, Jun. 25, 2008 p. 198-209.

International Search Report and Written Opinion From PCT/EP2021/052483 dated Apr. 12, 2021.

Dmitriy A. Yablonskiy, Alexander L. Sukstanskii, Jie Luo, and Xiaoqi Wang, "Voxel Spread Function Method for Correction of Magnetic Field Inhomogeneity Effects in Quantitative Gradient-Echo-Based MRI", Magnetic Resonance in Medicine 70:1283-1292 (2013).

\* cited by examiner

US 11,959,988 B2

ITERATIVE RECONSTRUCTION OF GRADIENT ECHO MAGNETIC RESONANCE IMAGES

CROSS REFERENCE TO RELATED APPLICATIONS

This application is a U.S. national phase application of International Application No. PCT/EP2021/052483 filed on Feb. 3, 2021, which claims the benefit of EP Application Serial No. 20157618.8 filed on Feb. 17, 2020 and U.S. Provisional Application Ser. No. 62/984,323 filed on Mar. 3, 2020.

FIELD OF THE INVENTION

The invention relates to Magnetic Resonance Imaging, in particular to gradient echo magnetic resonance imaging.

BACKGROUND OF THE INVENTION

A large static magnetic field is used by Magnetic Resonance Imaging (MRI) scanners to align the nuclear spins of atoms as part of the procedure for producing images within the body of a patient. This large static magnetic field is referred to as the B0 field or the main magnetic field. Various quantities or properties of the subject can be measured spatially using MM. For example, various electrical properties of a subject can be investigated using MM. Gradient echo magnetic resonance imaging is a commonly used method commonly used for rapidly acquiring magnetic resonance imaging data. It is commonly used for three-dimensional imaging.

U.S. Pat. No. 5,539,316 discloses a method of shimming an NMR magnet uses a plurality of 1D projections through a sample volume to determine the inhomogeneities of the field of the NMR magnet. The frequency distributions obtained are assembled from the phase signals of the various projections. In order to avoid frequency errors due to phase wrapping, the phase of each signal is monitored over time for discontinuities indicative of aliasing. For each phase wrap, the signal is "unwrapped" by adjusting the value of the phase signal by $2n$. The same method is used to establish a shim field map for each of the shim coils being used. With one shim coil at a time being driven with a predetermined current, the detection method is repeated to acquire a shim-base frequency map for each shim coil. The base frequency map is then subtracted from the shim-base frequency maps to obtain shim field maps. The proper shim currents are then acquired through matrix operations on the shim field maps and the base frequency map.

SUMMARY OF THE INVENTION

The invention provides for a medical system, a computer program, and a method in the independent claims. Embodiments are given in the dependent claims A difficulty with gradient echo magnetic resonance imaging is that inhomogeneities in the B0 field, also known as off-resonance effects, can cause signal voids. Embodiments may provide for a means of reducing signal voids due to off-resonance effects. This may be achieved by a process of upsampling an initial image and upsampling an off-resonance phase map. The initial image is reconstructed from measured gradient echo k-space data. A modulated image is then calculated by modulating the upsampled image with the upsampled off-resonance phase map. This modulated image is then used in an iterative scheme that uses data consistency with the measured gradient echo k-space data as well as demodulation by the upsampled off-resonance phase map to calculate an updated image. Several algorithms are described below.

In one aspect the invention provides for a medical system that comprises a memory storing machine-executable instructions. The medical system further comprises a processor configured for executing the machine-executable instructions and for controlling the medical system. Execution of the machine-executable instructions causes the processor to receive measured gradient echo k-space data. In magnetic resonance imaging data is acquired in k-space and then later reconstructed using Fourier transforms into image space.

The measured gradient echo k-space data is k-space data that has been acquired with a gradient echo magnetic resonance imaging protocol. Execution of the machine-executable instructions further causes the processor to receive an off-resonance phase map. An off-resonance phase map is a mapping of the off-resonance frequency for each voxel. It may for example be a B0 map that has been multiplied with the echo time of the gradient echo magnetic resonance imaging protocol used to measure the gradient echo k-space data. The off-resonance phase map may for example be received in the form of the actual off-resonance phase map or it may also be a B0 map which may be used to calculate the off-resonance phase map.

Execution of the machine-executable instructions further causes the processor to reconstruct an initial image from the measured gradient echo k-space data. In this step the measured gradient echo k-space data is used to reconstruct a magnetic resonance image in image space, herein referred to as the initial image.

In later steps the image will be corrected and refined. However, at this step an image is reconstructed without this correction. Execution of the machine-executable instructions further causes the processor to calculate an upsampled phase map from the off-resonance phase map. For the upsampled phase map and the later mentioned upsampled image an upsampled resolution is chosen. The upsampled phase map may for example be calculated by interpolating the off-resonance phase map for this higher resolution. Execution of the machine-executable instructions further causes the processor to calculate an upsampled image from the initial image. In this case the initial image is upsampled. This for example may also be through an interpolation process.

Execution of the machine-executable instructions further causes the processor to calculate a modulated image by modulating the upsampled image with the upsampled phase map. The modulated image is then affected by the upsampled phase map at a higher resolution than the initial image. The following steps are then performed iteratively to calculate a corrected image. First, updated k-space data is calculated by applying a data consistency algorithm to a k-space representation of the modulated image and the measured gradient echo k-space data. For example, the modulated image may be represented in k-space. This is the k-space representation. However, there is still the measured gradient echo k-space data. The application of the data consistency algorithm ensures that the k-space representation of the modulated image is adjusted so that it better fits the actually measured gradient echo k-space data.

In the next iterative step, the updated image is calculated from the updated k-space date. The calculation of the updated image comprises demodulation by the upsampled phase map. The calculating of the updated image further comprises applying a smoothing algorithm. The modulated image for further iterations results from the updated image. This embodiment may have the advantage that it provides for a means of reducing the effect of phase modulation within individual voxels. It is done in an iterative fashion and the corrected image is gradually improved.

As will be described below there are several different approaches in which this algorithm can be applied. In one approach the image is downsampled and upsampled for every iteration and a de-ringing algorithm or equivalent operation is applied. In another approach, during each duration a residual is calculated which is used to update the modulated image for each iteration. This algorithm resembles a compressed sensing type algorithm.

In another embodiment the step of calculating the modulated image by modulating the upsampled image by the upsampled phase map is performed iteratively during the iterative calculation of the corrected image. The calculation of the updated image from the updated k-space comprises calculating an intermediate image from the updated k-space data. The calculation of the updated image from the updated k-space further comprises calculating a demodulated image by demodulating the intermediate image with the upsampled phase map. The calculation of the updated image from the updated k-space data further comprises calculating the updated image from the demodulated image. The updated image is either output as a corrected image or used as the upsampled image in a further iteration.

The computations of the magnetic resonance images from the MR data sampled from k-space may be done by reconstruction software installed on a host computer of the magnetic resonance examination system. Alternatively, reconstruction may be done remotely separated in time and place form the magnetic resonance examination system and the MR data acquisition e.g. by uploading the gradient echo k-space data and the off-resonance phase map to 'the cloud' where correction and reconstructing may be done by dedicated correction and reconstruction software.

In another embodiment the updated image is calculated by applying a spatial smoothing filter to the demodulated image. For example, the downsampling at the end of each iteration may be performed by performing a smoothing operation.

In another embodiment the updated image is calculated by calculating demodulated k-space data from the demodulated image. The updated image is further calculated by calculating the updated image by applying a k-space mask to the demodulated k-space data and applying a de-ringing filter to the demodulated k-space data.

In another embodiment the data consistency algorithm is configured to calculate the updated k-space data using a fitting of the k-space representation of the modulated image to the measured gradient echo k-space data. In this case the k-space data that is in a vicinity of the actual measured data may be adjusted so that it better fits.

In another embodiment the data consistency algorithm is configured to calculate the updated k-space data by replacing a portion of the k-space representation of the modulated image with the measured gradient echo k-space data. There may be particular regions or lines of k-space data that have been acquired. K-space data that is within the vicinity of this may be removed from the k-space representation of the modulated image and replaced with the actual measured k-space data.

In another embodiment the updated k-space data results from a calculation of a residual between a projection of the modulated image into Fourier space and the measured gradient echo k-space data. The calculation of the updated image from the updated k-space data then comprises calculating a residual image by transforming the residual to image space. The calculation of the updated image from the updated k-space data then further comprises calculating a demodulated residual image by demodulating the residual image with the upsampled phase map. The calculation of the updated image from the updated k-space data then further comprises updating the modulated image with the demodulated residual image. The residual for example may be added to the modulated image. After this then the iterations will start over again.

In another embodiment the smoothing algorithm is a regularization term applied during the updating of the modulated image with the demodulated residual image. The regularization term has a smoothing effect on the data and in some cases may be equivalent to the spatial smoothing filter or the de-ringing filter in k-space.

In another embodiment the measured gradient echo k-space data is parallel imaging magnetic resonance imaging data that was acquired according to a parallel imaging magnetic resonance imaging protocol from multiple antenna elements. The initial image is reconstructed according to the parallel imaging magnetic resonance imaging protocol. The data consistency algorithm is configured to modify the k-space data representation of the modulated image with the measured gradient echo k-space data from each of the multiple antenna elements collectively. This embodiment may be beneficial because it may provide for a means of proving parallel imaging gradient echo images.

In another embodiment the off-resonance phase map is received as a B0 inhomogeneity map. Execution of the machine-executable instructions further causes the processor to calculate the off-resonance phase map from the B0 inhomogeneity map. For example, the off-resonance phase map may be calculated by multiplying the B0 inhomogeneity map with the echo time.

In another embodiment the medical system further comprises a magnetic resonance imaging system. The memory further contains pulse sequence commands configured for controlling the magnetic resonance imaging system to acquire the measured gradient echo k-space data according to the gradient echo magnetic resonance imaging protocol. Execution of the machine-executable instructions further causes the processor to control the magnetic resonance imaging system with the pulse sequence commands to acquire the measured gradient echo k-space data.

In another aspect the invention provides for a computer program that comprises machine-executable instructions for execution by a processor controlling a medical system. This may for example be a computer program product stored on a data carrier or transitory data storage medium. The execution of the machine-executable instructions causes the processor to receive measured gradient echo k-space data. Execution of the machine-executable instructions further causes the processor to receive an off-resonance phase map. Execution of the machine-executable instructions further causes the processor to reconstruct an initial image from the measured gradient echo k-space data.

Execution of the machine-executable instructions further causes the processor to calculate an upsampled phase map from the off-resonance phase map. Execution of the machine-executable instructions further causes the processor to calculate an upsampled image from the initial image. Execution of the machine-executable instructions further causes the processor to calculate a modulated image by modulating the upsampled image with the upsampled phase map. Execution of the machine-executable instructions further causes the processor to calculate a corrected image iteratively.

These iterative steps comprise calculating an updated k-space data by applying a data consistency algorithm to a k-space representation of the modulated image and the measured gradient echo k-space data. The iterative steps further comprise calculating an updated image from the updated k-space data. The calculation of the updated image comprises demodulation by the upsampled image. Calculating the updated image further comprises applying a smoothing algorithm. The modulated image for further iterations results from the updated image.

In another embodiment the step of calculating the modulated image by modulating the upsampled image by the upsampled phase map is performed iteratively during the iterative calculation of the corrected image. The calculation of the updated image from the updated k-space data comprises calculating an intermediate image from the updated k-space data. The calculation of the updated image from the updated k-space data further comprises calculating a demodulated image by demodulating the intermediate image with the upsampled phase map. The calculation of the updated image from the updated k-space data further comprises calculating the updated image from the demodulated image. The updated image is either output as the corrected image or used as the upsampled image in a further iteration.

In another embodiment the updated k-space data results from a calculation of a residual between a projection of the modulated image into Fourier space and the measured gradient echo k-space data. The calculation of the updated image from the updated k-space data comprises calculating a residual image by transforming the residual to image space. Calculating the updated image from the updated k-space further comprises calculating a demodulated residual image by demodulating the residual image with the upsampled phase map. Calculating the updated image from the updated k-space data further comprises updating the modulated image with the demodulated residual image.

In another embodiment, the measured gradient echo k-space data is received for one or more gradient echoes. The initial image is an initial magnetization image. The upsampled image is an upsampled magnetization image.

In another embodiment, the initial magnetization image is reconstructed for each of the one or more gradient echoes from the measured gradient echo k-space data. The upsampled magnetization image is calculated for each of the one or more gradient echoes from the initial magnetization image for each of the one or more gradient echoes. The modulated image is calculated for each of the one or more gradient echoes by modulating the upsampled image for each of the one or more gradient echoes with the upsampled phase map corresponding to the echo time of the respective gradient echo. The corrected image for each of the one or more gradient echoes is calculated iteratively. The updated k-space data is calculated by applying the data consistency algorithm to the k-space representation of the modulated image for each of the one or more gradient echoes and the measured gradient echo k-space data. The update image is calculated for each of the one or more gradient echoes from the updated k-space data.

In another embodiment, the initial image is calculated using a signal model dependent upon one or more parameter mappings. The iterative calculation of the corrected image comprises updating the parameter mappings.

In another embodiment, the signal model is a Dixon model.

In another embodiment, the signal model is an R2* mapping.

In another embodiment, the signal model is a parameter mapping model.

In another aspect the invention provides for a method of operating a medical system. The method comprises receiving measured gradient echo k-space data. The method further comprises receiving an off-resonance phase map. The method further comprises reconstructing an initial image from the measured gradient echo k-space data. The method further comprises calculating an upsampled phase map from the off-resonance phase map. The method further comprises calculating an upsampled image from the initial image. The method further comprises calculating a modulated image by modulating the upsampled image with the upsampled phase map. The method further comprises calculating a corrected image iteratively. The iterative calculation of the corrected image comprises calculating updated k-space data by applying a data consistency algorithm to a k-space representation of the modulated image and the measured gradient echo k-space data.

The calculation of the corrected image iteratively further comprises calculating an updated image from the updated k-space data. The calculation of the updated image comprises demodulation by the upsampled phase map. The calculation of the updated image further comprises applying a smoothing algorithm. The upsampled image for further iterations results from the updated image.

It is understood that one or more of the aforementioned embodiments of the invention may be combined as long as the combined embodiments are not mutually exclusive.

As will be appreciated by one skilled in the art, aspects of the present invention may be embodied as a apparatus, method, computer program or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon. A computer program comprises the computer executable code or "program instructions".

Any combination of one or more computer readable medium(s) may be utilized. The computer readable medium may be a computer readable signal medium or a computer readable storage medium. A 'computer-readable storage medium' as used herein encompasses any tangible storage medium which may store instructions which are executable by a processor of a computing device. The computer-readable storage medium may be referred to as a computer-readable non-transitory storage medium. The computer-readable storage medium may also be referred to as a tangible computer readable medium. In some embodiments, a computer-readable storage medium may also be able to store data which is able to be accessed by the processor of the computing device. Examples of computer-readable storage media include, but are not limited to: a floppy disk, a magnetic hard disk drive, a solid state hard disk, flash memory, a USB thumb drive, Random Access Memory (RAM), Read Only Memory (ROM), an optical disk, a magneto-optical disk, and the register file of the processor. Examples of optical disks include Compact Disks (CD) and Digital Versatile Disks (DVD), for example CD-ROM, CD-RW, CD-R, DVD-ROM, DVD-RW, or DVD-R disks. The term computer readable-storage medium also refers to various types of recording media capable of being accessed by the computer device via a network or communication link. For example a data may be retrieved over a modem, over the internet, or over a local area network. Computer executable code embodied on a computer readable medium may be transmitted using any appropriate medium, including but not limited to wireless, wireline, optical fiber cable, RF, etc., or any suitable combination of the foregoing.

A computer readable signal medium may include a propagated data signal with computer executable code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

'Computer memory' or 'memory' is an example of a computer-readable storage medium. Computer memory is any memory which is directly accessible to a processor. 'Computer storage' or 'storage' is a further example of a computer-readable storage medium. Computer storage is any non-volatile computer-readable storage medium. In some embodiments computer storage may also be computer memory or vice versa.

A 'processor' as used herein encompasses an electronic component which is able to execute a program or machine executable instruction or computer executable code. References to the computing device comprising "a processor" should be interpreted as possibly containing more than one processor or processing core. The processor may for instance be a multi-core processor. A processor may also refer to a collection of processors within a single computer system or distributed amongst multiple computer systems. The term computing device should also be interpreted to possibly refer to a collection or network of computing devices each comprising a processor or processors. The computer executable code may be executed by multiple processors that may be within the same computing device or which may even be distributed across multiple computing devices.

Computer executable code may comprise machine executable instructions or a program which causes a processor to perform an aspect of the present invention. Computer executable code for carrying out operations for aspects of the present invention may be written in any combination of one or more programming languages, including an object oriented programming language such as Java, Smalltalk, C++ or the like and conventional procedural programming languages, such as the "C" programming language or similar programming languages and compiled into machine executable instructions. In some instances the computer executable code may be in the form of a high level language or in a pre-compiled form and be used in conjunction with an interpreter which generates the machine executable instructions on the fly.

The computer executable code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Generally, the program instructions can be executed on one processor or on several processors. In the case of multiple processors, they can be distributed over several different entities like clients, servers etc. Each processor could execute a portion of the instructions intended for that entity. Thus, when referring to a system or process involving multiple entities, the computer program or program instructions are understood to be adapted to be executed by a processor associated or related to the respective entity.

Aspects of the present invention are described with reference to flowchart illustrations and/or block diagrams of methods, apparatus (systems) and computer program products according to embodiments of the invention. It will be understood that each block or a portion of the blocks of the flowchart, illustrations, and/or block diagrams, can be implemented by computer program instructions in form of computer executable code when applicable. It is further under stood that, when not mutually exclusive, combinations of blocks in different flowcharts, illustrations, and/or block diagrams may be combined. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

A 'user interface' as used herein is an interface which allows a user or operator to interact with a computer or computer system. A 'user interface' may also be referred to as a 'human interface device.' A user interface may provide information or data to the operator and/or receive information or data from the operator. A user interface may enable input from an operator to be received by the computer and may provide output to the user from the computer. In other words, the user interface may allow an operator to control or manipulate a computer and the interface may allow the computer indicate the effects of the operator's control or manipulation. The display of data or information on a display or a graphical user interface is an example of providing information to an operator. The receiving of data through a keyboard, mouse, trackball, touchpad, pointing stick, graphics tablet, joystick, gamepad, webcam, headset, pedals, wired glove, remote control, and accelerometer are all examples of user interface components which enable the receiving of information or data from an operator.

A 'hardware interface' as used herein encompasses an interface which enables the processor of a computer system to interact with and/or control an external computing device and/or apparatus. A hardware interface may allow a processor to send control signals or instructions to an external computing device and/or apparatus. A hardware interface may also enable a processor to exchange data with an external computing device and/or apparatus. Examples of a hardware interface include, but are not limited to: a universal serial bus, IEEE 1394 port, parallel port, IEEE 1284 port, serial port, RS-232 port, IEEE-488 port, Bluetooth connection, Wireless local area network connection, TCP/IP connection, Ethernet connection, control voltage interface, MIDI interface, analog input interface, and digital input interface.

A 'display' or 'display device' as used herein encompasses an output device or a user interface adapted for displaying images or data. A display may output visual, audio, and or tactile data. Examples of a display include, but are not limited to: a computer monitor, a television screen, a touch screen, tactile electronic display, Braille screen, Cathode ray tube (CRT), Storage tube, Bi-stable display, Electronic paper, Vector display, Flat panel display, Vacuum fluorescent display (VF), Light-emitting diode (LED) displays, Electroluminescent display (ELD), Plasma display panels (PDP), Liquid crystal display (LCD), Organic light-emitting diode displays (OLED), a projector, and Head-mounted display.

K-space data is defined herein as being the recorded measurements of radio frequency signals emitted by atomic spins using the antenna of a Magnetic resonance apparatus during a magnetic resonance imaging scan. K-space data is an example of medical image data. A Magnetic Resonance Imaging (MRI) image or MR image is defined herein as being the reconstructed two- or three-dimensional visualization of anatomic data contained within the magnetic resonance imaging data. This visualization can be performed using a computer.

BRIEF DESCRIPTION OF THE DRAWINGS

In the following preferred embodiments of the invention will be described, by way of example only, and with reference to the drawings in which.

DETAILED DESCRIPTION OF THE EMBODIMENTS

Like numbered elements in these figures are either equivalent elements or perform the same function. Elements which have been discussed previously will not necessarily be discussed in later figures if the function is equivalent.

Figure 1:
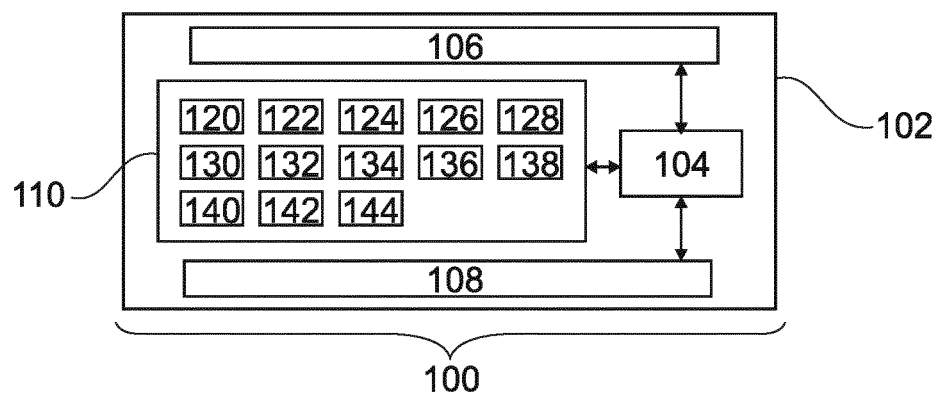
FIG. 1 illustrates an example of a medical system.

FIG. 1 illustrates an example of a medical system 100. The medical system 100 is shown as comprising a computer 102. The computer 102 is intended to represent one or more computers or computer systems. The medical system 100 may take different forms in different examples. In one example the computer 102 could be a remote or cloud computing system that provides computational or image processing services. In another example the computer 102 could be part of a magnetic resonance imaging system. In yet other examples the computer 102 could be a workstation that is located at a radiology department or other location for healthcare professionals.

The computer 102 is shown as comprising a processor 104. The processor 104 is intended to represent one or more processors that may be contained within one or more computers. The processors 104 may also be multiple computing cores. The processor 104 is shown as being connected to an optional hardware interface 106. The hardware interface 106 may for example provide an interface which enables the processor 104 to control other components of the medical system 100. For example, if the medical system 100 comprises a magnetic resonance imaging system, then the hardware interface 106 may be used by the processor 104 to control the magnetic resonance imaging system.

The computer 102 is further shown as containing an optional user interface 108. For example, if the computer 102 is a computer that controls or does image reconstruction for a magnetic resonance imaging system the user interface 108 may provide for a means of an operator to interact with and control the medical system 100. The processor 104 is further shown as being connected to a memory 110. The memory 110 is intended to represent any memory that may be accessible to the processor 104. This for example may be a non-transitory storage medium, a hard drive, or other storage medium.

The memory 110 is shown as containing machine-executable instructions 120. The machine-executable instructions 120 contain instructions which enable the processor 104 to in some instances control the rest of the medical system 100 as well as perform various data and image processing tasks.

The memory 110 is further shown as containing measured gradient echo k-space data 122. The measured gradient echo k-space data 122 is k-space data that has been acquired according to a gradient echo magnetic resonance imaging protocol. The memory 110 is further shown as containing an off-resonance phase map. The off-resonance phase map 124 may be received with the measured gradient echo k-space data 122. For example, a B0 map may be measured at the same time as the measured gradient echo k-space data or before or afterwards and then used to calculate the off-resonance phase map 124. The memory 110 is further shown as containing an initial image 126 that has been reconstructed from the measured gradient echo k-space data 122. It should be noted that in some cases the measured gradient echo k-space data 122 may be parallel imaging k-space data. In which case there may be k-space data which is acquired for more than one coil element and the initial image 126 may be reconstructed using a coil sensitivity map.

The memory 110 is further shown as containing an upsampled phase map 128 and an upsampled image 130. The upsampled phase map 128 and the upsampled image 130 have a resolution that is higher than the initial image 126. Additionally, the upsampled phase map 128 and the upsampled image 130 have a chosen resolution that is the same for the both. The memory 110 is further shown as containing a modulated image 132. The modulated image 132 is constructed by modulating the upsampled image 130 with the upsampled phase map 128. The memory 110 is further shown as containing a corrected image 134 that has been calculated iteratively using the modulated image 132.

The memory 110 is further shown as containing a corrected image 134 and updated k-space data 136. The updated k-space data 136 is calculated using a data consistency algorithm 138 to compare a k-space representation 140 of the modulated image 132 with the measured gradient echo k-space data 122. The memory 110 is further shown as containing an updated image 142 that is calculated by demodulation by the upsampled phase map. A smoothing algorithm 144 is used in calculating the updated image 142. The modulated image 132 for further iterations is calculated or results from the updated image 142.

Figure 2:
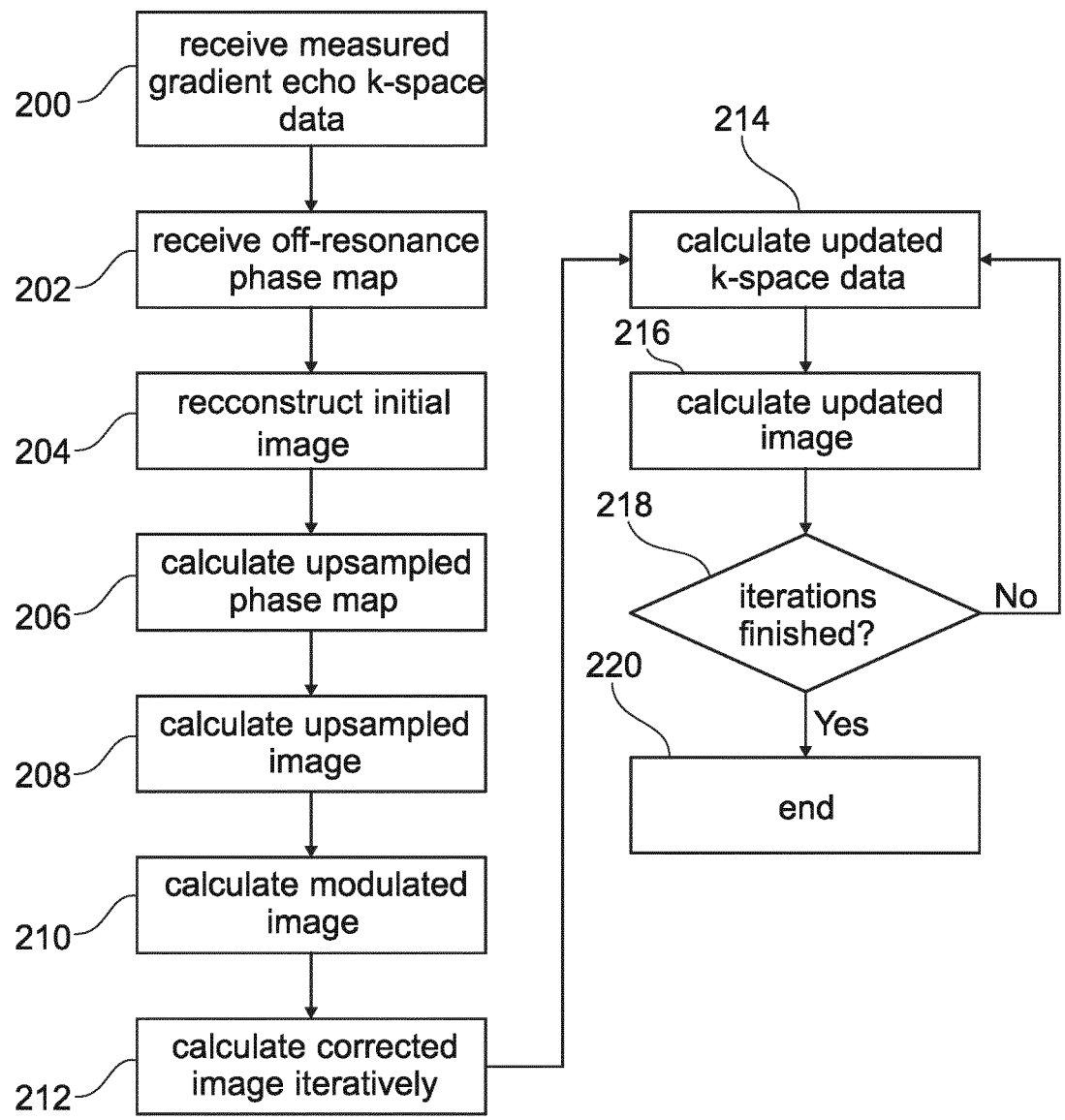
FIG. 2 shows a flow chart which illustrates a method of operating the medical system of FIG. 1.

FIG. 2 shows a flowchart which illustrates a method of operating the medical system of FIG. 1. First, in step 200, the measured gradient echo k-space data 122 is received. Next, in step 202, the off-resonance phase map 124 is received. In step 204, the initial image 126 is reconstructed from the measured gradient echo k-space data 122. In step 206, the upsampled phase map is calculated from the off-resonance phase map 124. This for example may be calculated via interpolation. Next, in step 208, the upsampled image 130 is calculated from the initial image 126. This may also be calculated via interpolation. The size of the voxels in the upsampled phase map 128 and the upsampled image 130 is the same.

Next, in step 210, the modulated image 132 is calculated by modulating the upsampled image 130 with the upsampled phase map 128. Next, in step 212, the corrected image 134 is calculated iteratively. Steps 214 and 216 represent some of the iterative steps. In step 214 the updated k-space data 136 is calculated by applying a data consistency algorithm 138 to a k-space representation 140 of the modulated image 132 and the measured gradient echo k-space data 122. In step 216 the updated image 142 is calculated from the updated k-space data 136.

The calculation of the updated image 142 comprises demodulation by the upsampled phase map 128. When calculating the updated image further comprises applying a smoothing algorithm 144. The modulated image for further iterations results from the updated image 142. In some cases, the updated image replaces the modulated image. In other cases, the updated image is a residual which is used to update the modulated image.

Figure 3:
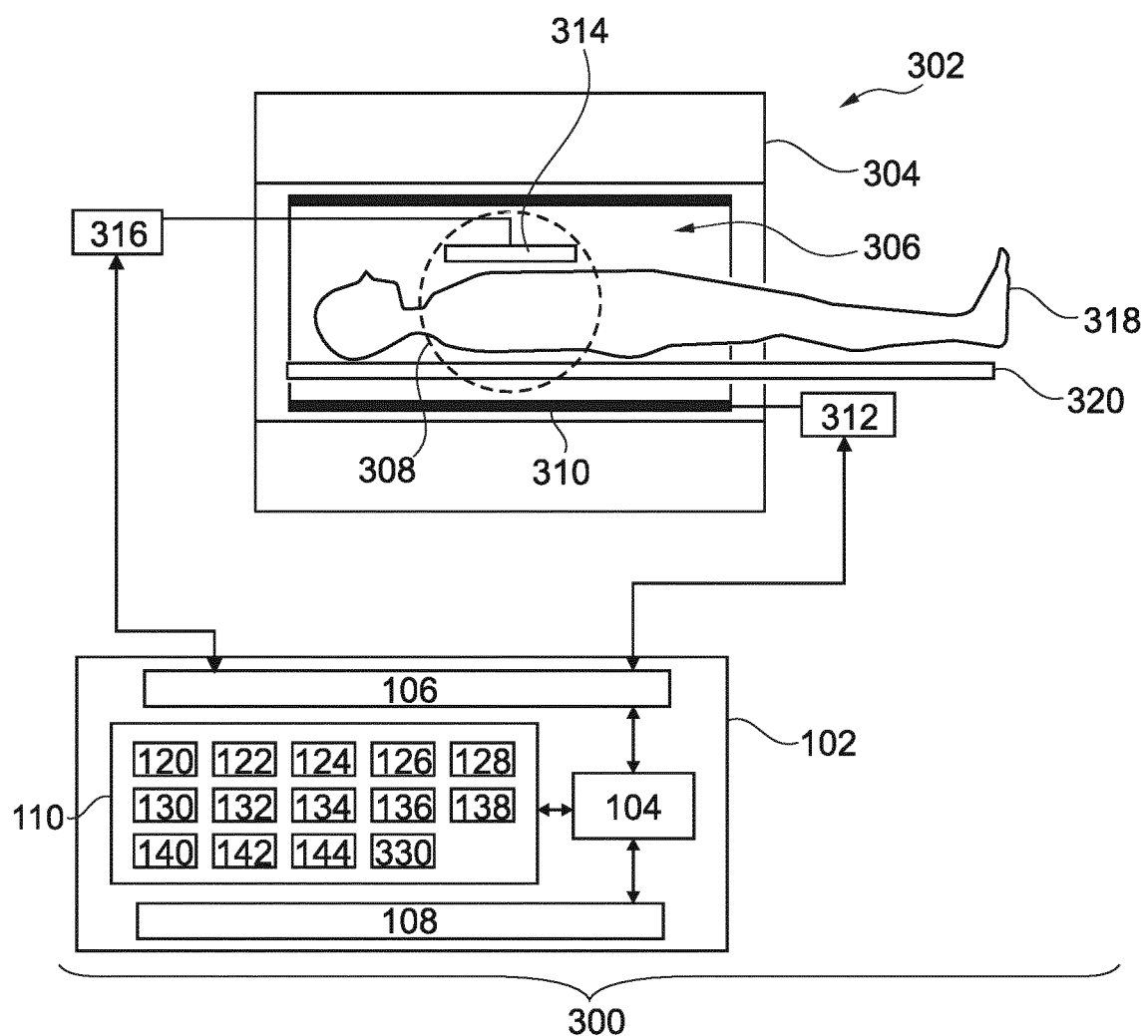
FIG. 3 illustrates a further example of a medical system.

FIG. 3 illustrates a further example of a medical system 300. The medical system of FIG. 3 is similar to the medical system 100 of FIG. 1 except the medical system additionally comprises a magnetic resonance imaging system 302.

The magnetic resonance imaging system 302 comprises a magnet 304. The magnet 304 is a superconducting cylindrical type magnet with a bore 306 through it. The use of different types of magnets is also possible; for instance it is also possible to use both a split cylindrical magnet and a so called open magnet. A split cylindrical magnet is similar to a standard cylindrical magnet, except that the cryostat has been split into two sections to allow access to the iso-plane of the magnet, such magnets may for instance be used in conjunction with charged particle beam therapy. An open magnet has two magnet sections, one above the other with a space in-between that is large enough to receive a subject: the arrangement of the two sections area similar to that of a Helmholtz coil. Open magnets are popular, because the subject is less confined. Inside the cryostat of the cylindrical magnet there is a collection of superconducting coils.

Within the bore 306 of the cylindrical magnet 304 there is an imaging zone 308 where the magnetic field is strong and uniform enough to perform magnetic resonance imaging. A region of interest 309 is shown within the imaging zone 308. A subject 318 is shown as being supported by a subject support 320 such that at least a portion of the subject 318 is within the imaging zone 308 and the region of interest 309.

Within the bore 306 of the magnet there is also a set of magnetic field gradient coils 310 which is used for acquisition of preliminary magnetic resonance data to spatially encode magnetic spins within the imaging zone 308 of the magnet 304. The magnetic field gradient coils 310 connected to a magnetic field gradient coil power supply 312. The magnetic field gradient coils 310 are intended to be representative. Typically magnetic field gradient coils 310 contain three separate sets of coils for spatially encoding in three orthogonal spatial directions. A magnetic field gradient power supply supplies current to the magnetic field gradient coils. The current supplied to the magnetic field gradient coils 310 is controlled as a function of time and may be ramped or pulsed.

Adjacent to the imaging zone 308 is a radio-frequency coil 314 for manipulating the orientations of magnetic spins within the imaging zone 308 and for receiving radio transmissions from spins also within the imaging zone 308. The radio frequency antenna may contain multiple coil elements. The radio frequency antenna may also be referred to as a channel or antenna. The radio-frequency coil 314 is connected to a radio frequency transceiver 316. The radio-frequency coil 314 and radio frequency transceiver 316 may be replaced by separate transmit and receive coils and a separate transmitter and receiver. It is understood that the radio-frequency coil 314 and the radio frequency transceiver 316 are representative.

The radio-frequency coil 314 is intended to also represent a dedicated transmit antenna and a dedicated receive antenna. Likewise the transceiver 316 may also represent a separate transmitter and receivers. The radio-frequency coil 314 may also have multiple receive/transmit elements and the radio frequency transceiver 316 may have multiple receive/transmit channels. For example if a parallel imaging technique such as SENSE is performed, the radio-frequency could 314 will have multiple coil elements.

The transceiver 316 and the gradient controller 312 are shown as being connected to the hardware interface 106 of a computer system 102.

The memory 110 is additionally shown as comprising pulse sequence commands 330. The pulse sequence commands 330 are configured to acquire the measured gradient echo k-space data 122 according to a gradient echo magnetic resonance imaging protocol.

Figure 4:
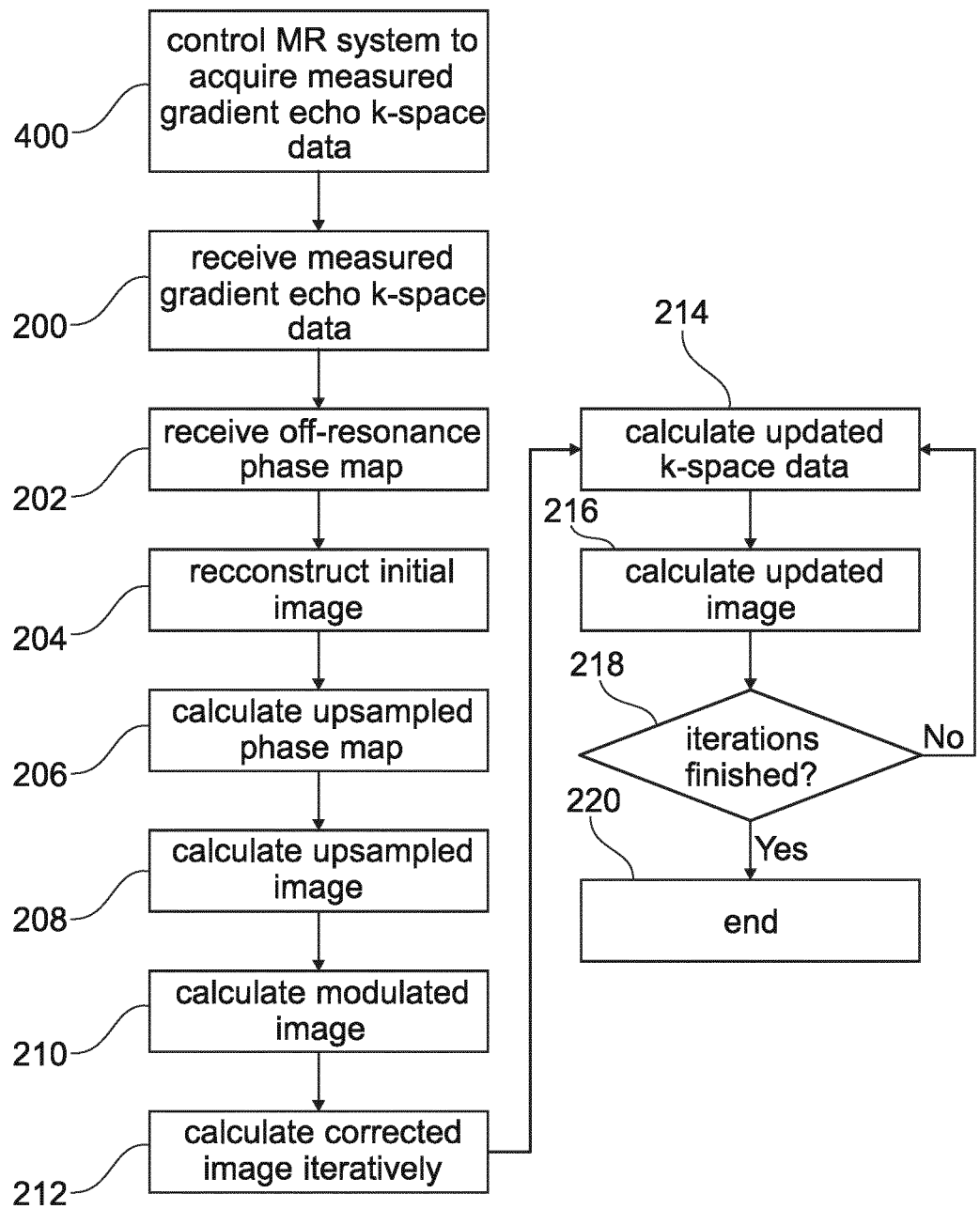
FIG. 4 shows a flow chart which illustrates a method of operating the medical system of FIG. 3.

FIG. 4 shows a flowchart which illustrates a method of operating the medical system 300 of FIG. 3. The method illustrated in FIG. 4 is similar to that shown in FIG. 2. The method starts with step 400. In step 400 the magnetic resonance imaging system 302 is controlled with the pulse sequence commands to acquire the measured gradient echo k-space data 122.

An image reconstruction method is disclosed which reduces signal voids in gradient echo MR images which are caused by off-resonances in the imaged object. It also improves the quantitative accuracy of R2* maps. The new method is compatible with application of anti-ringing filters and potentially faster than other published methods with the same aim.

In MRI, an image is reconstructed from a set of sampled k-space data (e.g. by simple Fourier-transform for the case of regular Cartesian sampling). Since only a limited range in k-space is sampled, the reconstructed image may show some ringing at strong edges of the imaged object. To reduce ringing, it is common to apply a filter in k-space which reduces the amplitude of the ringing artefact. There are many anti-ringing filter shapes but all have in common that they attenuate signal for large values of |k|.

Gradient echo sequences are susceptible to local variations of the magnetic field (off-resonance). Common gradient echo image artefacts that are caused by off-resonances include geometric distortion, signal inhomogeneity (ripple or ringing-like structures) and signal voids. Signal voids occur in those location in the image where the gradient of the off-resonance is large because this leads to intra-voxel dephasing.

Figure 5:
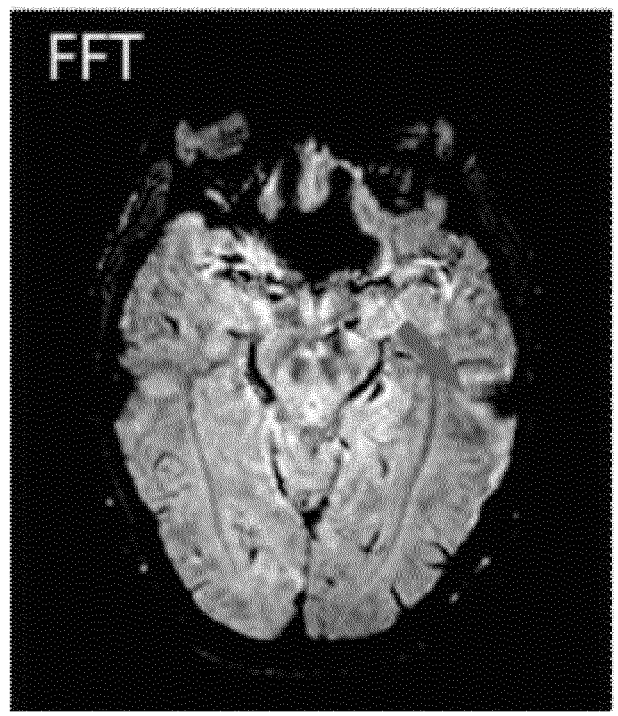
FIG. 5 illustrates a reconstruction of an initial image.
Figure 6:
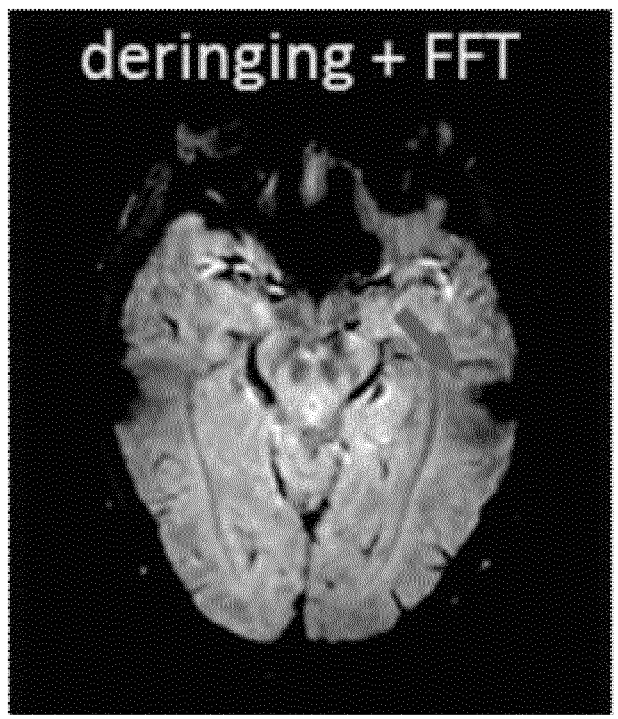
FIG. 6 shows an alternative reconstruction of the image of FIG. 5 using a de-ringing algorithm before performing the FFT.
Figure 7:
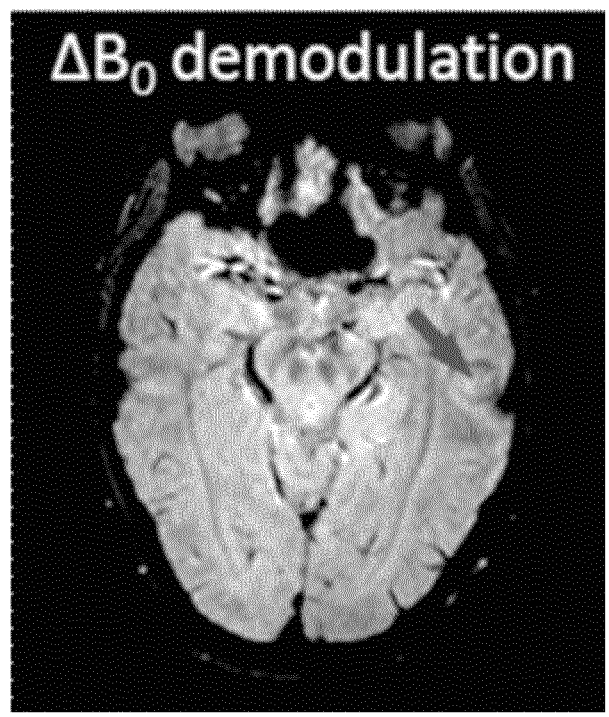
FIG. 7 shows a further reconstruction of the image of FIG. 5 using an iterative reconstruction as described herein.

FIGS. 5, 6, and 7 shows that applying an anti-ringing filter can increase off-resonance artefacts in gradient echo scans. FIGS. 5, 6 and 7 illustrate the benefit of some examples which construct a corrected image iteratively. FIG. 5 shows an image reconstructed by the simple application of an FFT. FIG. 5 would be equivalent to the initial image. Image 6 shows the results of an FFT after applying a de-ringing filter to the measured gradient echo k-space data. Image 7 shows the result of an iteratively calculated corrected image.

In FIGS. 5, 6, and 7 example images from a 3D FFE brain scan acquired at an echo time of 27 ms. (3 Tesla, 1×1×2 mm3 voxel size). FIG. 5 shows the image reconstructed by simple application of FFT. FIG. 6 shows the result of FFT after applying a de-ringing filter. FIG. 7 shows the result of the proposed method. Comparing the left and central image, it is clear that application of the anti-ringing filter increases the size of the signal voids (arrows). The proposed method in FIG. 7 has smaller signal voids than the FFT image, yet in this reconstruction the same anti-ringing filter as in the reconstruction of the central image was used.

Examples provide for a reconstruction algorithm which may reduce signal voids in gradient echo images and allows applying an anti-ringing filter. Another advantage is that the quantitative accuracy of R2* values, which can be determined from multi-echo GE scans, is improved (see FIGS. 8, 9, and 10 below).

Figure 8:
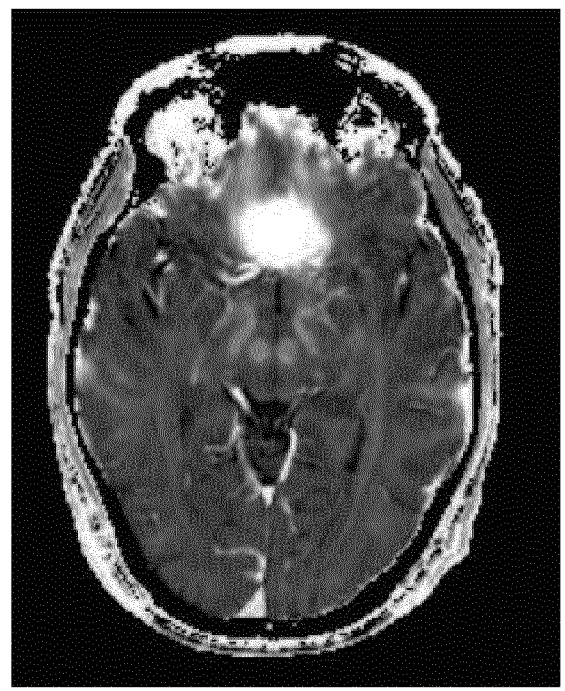
FIG. 8 illustrates a R2* map computed using a standard reconstruction.

FIG. 8 illustrates an R2* map computed from a standard reconstruction. This is a de-ringing followed by an FFT transform.

Figure 9:
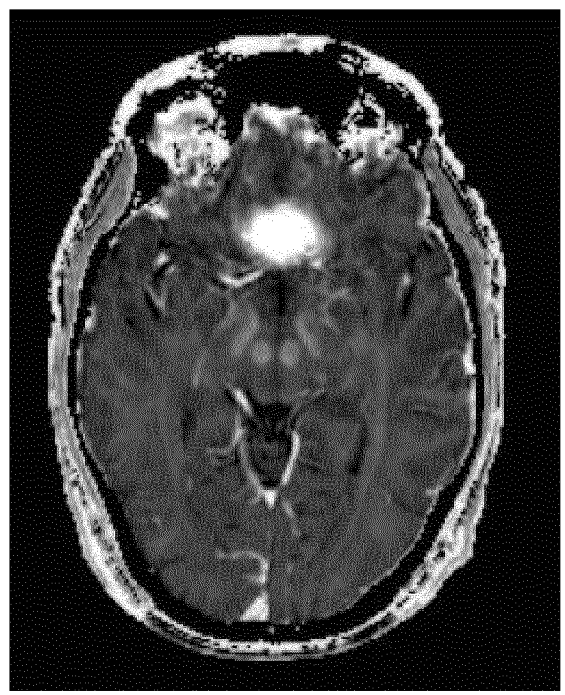
FIG. 9 illustrates a reconstruction of the same data as in FIG. 8 using a reconstruction as described herein.

FIG. 9 shows an R2* map calculated according to the first example algorithm disclosed below.

Figure 10:
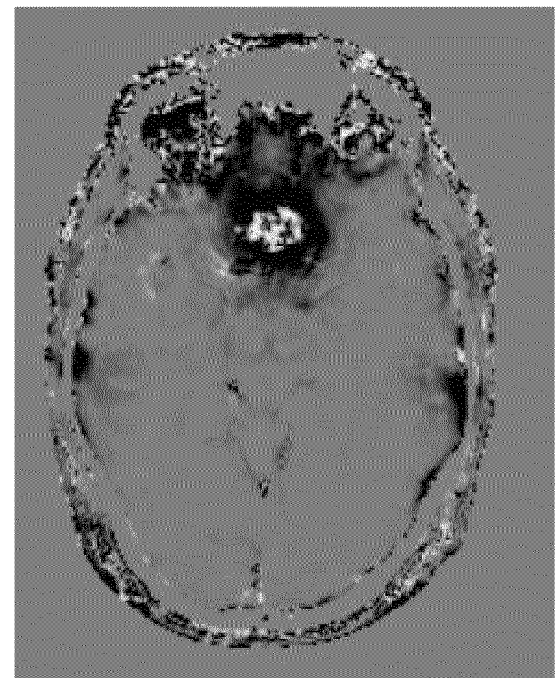
FIG. 10 shows a difference between FIGS. 8 and 9.

FIG. 10 shows an image which shows a difference between FIGS. 8 and 9. FIG. 9 illustrates how the reconstruction method improves the homogeneity of R2* values in regions with strong off-resonance gradients.

In the disclosed algorithms, instead of reconstructing the true object magnetization at echo time TE, the object magnetization is reconstructed without the phase variation that is caused by the off-resonance. To this end, the algorithm uses an off-resonance map df, which may be approximate. The magnetization is determined in an iterative procedure driven by data consistency. Examples may be much faster and easier to use than other algorithms to reduce static off-resonance artifacts.

A first example of a reconstruction algorithm is discussed below.

Let s be the acquired k-space data, df an off-resonance map, and r an anti-ringing filter. The image reconstruction is iteratively improving the image $m_i$:

Let s be the acquired k-space data, df an off-resonance map, and r a de-ringing filter.

The image reconstruction is iteratively improving the image $m_i$:

Initialization: $m_0=0$ (step 204) (the, $\Phi$=upsample ($e^{-i2\pi df TE}$) (step 206))

Iteration step i→i+1 (step 212):

upsample image (step 208): $m_h$=upsample($m_i$)

modulate upsampled image with $B_0$ phase: m'h=$m_h \cdot \Phi$ (step 210)

transform to k-space: $s'_h = F^{-1}(m'_h)$ set central part of $s_h$ to acquired data: $s'_h$[acq. region]=s (step 214)

transform to image-space: $m'_h = F(s'_h)$ demodulate $B_0$ phase: $m_h = m'_h / \Phi$ down-sample and dering image: $s_h = F^{-1}(m_h)$ (step 216)
$m_{i+1} = F(r \cdot s_h[\text{acq.region}])$ Here, upsample is an operation that increases the resolution of an image (a factor of two was used for the result shown in FIG. 1). I.e. the image containing the off-resonance phase is modeled at a higher spatial resolution than acquired. In this way, the intra voxel dephasing in this space is reduced to an acceptable level.

This iteration scheme converges quickly (20 iterations were used for the result in FIG. 7).

The off-resonance map can either be obtained in a separate measurement or, in the case of a multi-echo FFE scan, calculated from the first echoes. The required accuracy of df is fairly low because all phase errors caused by an inaccurate off-resonance map, will be absorbed by the reconstructed magnetization.

The above algorithm may be modified. For example, the initial magnetization image $m_0=0$. As an alternative the initial magnetization image may be reconstructed from the acquired k-space data.

An alternative method iteratively calculates a residual which is used to modify the image from the previous iteration. It resembles a compressed sensing algorithm. Below a sample algorithm is detailed using the following conventions: S is a coil sensitivity map, F is a Fourier transform, P: Projection on measured profiles in k-space aka subsampling mask/weights, and Superscript "H" refers to Hermitian conjugate, "−1" to inverse.

Minimization problem $\min_m \|PF\Phi Um - y\|_2^2 + \lambda R(m)$

Here, R is a regularization term, e.g. a smoothness promoting functional Setting the gradient of the objective function with respect to m to zero we get an equation to solve:

$$U^H \Phi^H F^H P^H (PF\Phi Um - y) + \lambda \frac{\partial R(m)}{\partial m} = 0$$

Instead of always upsampling with U and downsampling with UH, we solve the problem in high-resolution, replacing m→$m_h$=Um:

$$\Phi^H F^H P^H (PF\Phi m_h - y) + \lambda \frac{\partial R_h(m_h)}{\partial m_h} = 0$$

Initialize m and upsample to $m_h$ (step 208)
Iteration step: (step 212)
Modulate with off-resonance phase: $m'_h = \Phi m_h$ (step 210)
Transform to k-space and project: $s'_h = PFm'_h$
Compute residual with measured data: $r'_h = s'_h - y$ (step 214)
Transform back to image space: $\delta m'_h = F^H P^H r'_h$
Demodulate off-resonance phase: $\delta m'_h = \delta m/\Phi$
Compute update of $m_h$ given step-size t:

$$m_h = m_h + t\left(\delta m_h + \lambda \frac{\partial R_h(m_h)}{\partial m_h}\right)$$

(step 216, $\delta m_h$ is the demodulated residual image)
Downsample final $m_h$ to m The above algorithm may also be combined with parallel imaging. An example algorithm of the above algorithm incorporating parallel imaging is:

Minimization problem $\min_m \|PF\Phi Um - y\|_2^2 + \lambda R(m)$

Here, S contains the coil sensitivities, mapping to the measured channels
The high-res equation then reads (y is then multi-coil data):

$$\Phi^H F^H S^H P^H (PFS\Phi m_h - y) + \lambda \frac{\partial R_h(m_h)}{\partial m_h} = 0$$

Initialize m and upsample to $m_h$
Iteration step:
Modulate with off-resonance phase: $m'_h = \Phi m_h$
Transform to multi-coil k-space and project: $s'_{h,c} = PFSm'_h$
Compute residual with measured data: $r'_h = s'_h - y$
Transform back to image space, incl channel-combination: $\delta m'_h = S^H F^H P^H r'_h$
Demodulate off-resonance phase: $\delta m_h = \delta m/\Phi$
Compute update of $m_h$ given step-size t:

$$m_h = m_h + t\left(\delta m_h + \lambda \frac{\partial R_h(m_h)}{\partial m_h}\right)$$

Downsample final $m_h$ to m

Intra-voxel dephasing in gradient-echo MRI can also lead to signal dropout and other artifacts caused by strong phase-gradients, for example due to strong variations of the off-resonance field. The example below describes a method to correct for these artifacts by exploiting available information in multi-echo gradient echo MRI scans. It leverages model-based reconstruction and builds on the above disclosed method for reducing static $B_0$-induced artifacts. Including multi-echo information, in particular information from shorter echo-times, it is possible to overcome the limitations for correcting errors present in single-echo methods, which is given approximately for a phase-shift of pi/voxel.

The problems of B0-inhomogeneities are well-known in gradient-echo MM. For example, static B0-off-resonance gradients can lead to intra-voxel dephasing, in particular for low-resolution scans and/or at long echo-times. In addition to the off-resonance gradient, the phase-difference across a voxel is also proportional to the echo-time, so that longer echo-times are more severely affected.

Methods exist to correct for intra-voxel dephasing. However, these can only work up to the limit where the signal is shifted outside the acquired k-space region, which happens approximately when the phase-difference across an acquisition voxel exceeds pi.

For multi-echo gradient scans, for example for R2*-mapping or SWI, additional information is available from short TE echoes. Given a model for the signal behaviour as a function of echo-time, intra-voxel dephasing in late echo-time images can be mitigated.

The algorithm below builds on the above disclosed algorithm and assumes an approximation of the off-resonance field, B', as given. This is not a severe restriction, since the assumed off-resonance map needs only to reflect the strongest gradients. Furthermore, we assume a signal model describing the signal behavior as a function of echo-time, e.g. the mono-exponential $R_2^*$-decay model given by:

$$s_j' = m(r)e^{-t_j R^*_2(r)} e^{i\gamma t_j \Delta B(r)} e^{i\gamma t_j B'(r)} = s_j(r) e^{i\gamma t_j B'(r)} \quad (1)$$

Here, s is the signal at position r, m is the complex magnetization (with only slowly varying phase), $R^*_2$ is the transverse dephasing rate, B' is the assumed approximate off-resonance field (capturing the strong phase variations), $\Delta B$ is the remaining off-resonance field not demodulated, which still causes an echo-time dependence, and $t_j$ is the echo-time of the j-th echo and $\gamma$ the gyromagnetic ratio. Symbols with a prime (') are supposed to refer to quantities which include the phase modulation caused by B'. Other models may be appropriate depending on the desired application. Ignoring parallel imaging for simplicity (or compressing multiple channels to one), this can be related the acquired k-space data via the usual Fourier relation, with F the Fourier Transform $$\rho_j(k) = F(s_j) \quad (2)$$

Solving the minimization problem $$\operatorname{argmin}_{m, R^*_2} \|\rho_j^{measured}(k) - F(s_j(r; m, R^*_2))\| \quad (3)$$

Yields the parameter maps m and $R^*_2$. However, due to dephasing, $R^*_2$ will be biased. To compensate, we apply the above disclosed method in the forward model. Instead of directly solving the above minimization problem, instead upsampling to a higher resolution at which the approximate off-resonance field B' is modulated is performed. After Fourier Transform, the signal can be compared with the acquired data (low resolution), to compute a residual.

In detail steps performed in each iteration are the following, given current m, $R^*_2$, $\Delta B$
Compute $s_j$ for all echoes j via equation (1) (or other model)
Upsample to high resolution: $s_j^h$=upsample(s_j)
Modulate large phase variations at high resolution:

$$s_j^{h'} = s_j^h e^{i\gamma t_j B'} = s_j^h \Phi$$

Apply FFT: $\rho'_j = F(s_j^{h'})$
Set actually measured part of k-space $\rho'_j$ to acquired data: $\rho'_j[\text{acq region}] = \rho_j^{measured}$ Inverse Fourier Transform to image space: $s_j^{h'} = F^{-1}(\rho'_j)$
Demodulate phase: $s_j^h = s_j^{h'}/\Phi$
Back to k-space for deringing: $\rho_j = F(s_j^h)$
Downsample and dering: $s_j = F^{-1}(r\rho_j[\text{acq region}])$ Deringing filter described by r, e.g. Kaiser-Bessel
Fit m, $R^*_2$, $\Delta B$ from set of s_j images This can work in 2D (given information about B0 gradients across slices) and 3D.

Other signal models that may be applied include: Multi-exponential decay, Multi-Component Models, Water-Fat/Chemical Shift Models, Dictionary Matching, Subspace Projection, and others.

Alternative Algorithms: Instead of projecting on the measured k-space data, a minimization approach could be used similar to Compressed SENSE. In the general case, the B0-demodulation could be fully integrated into CSSense reconstruction.

Figure 11:
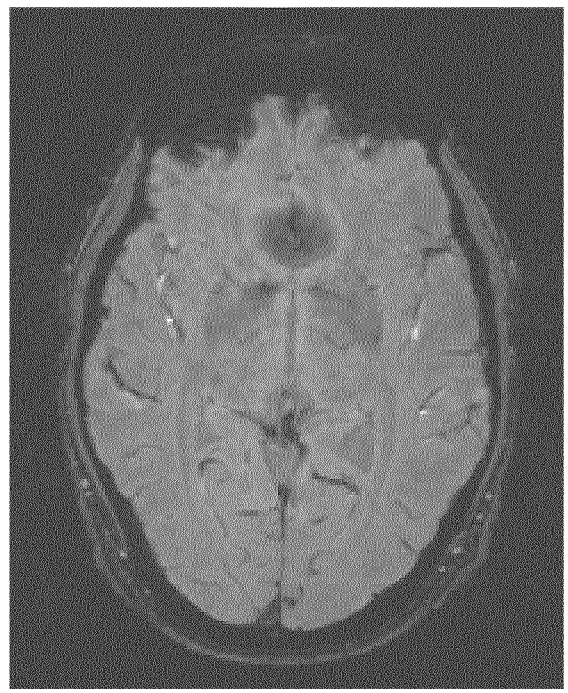
FIG. 11 shows an MRI image that is a reconstruction of the last echo of a multi-echo scan.

FIG. 11 shows the last echo of multi-echo scan with 4 echoes after FFT from raw data.

Figure 12:
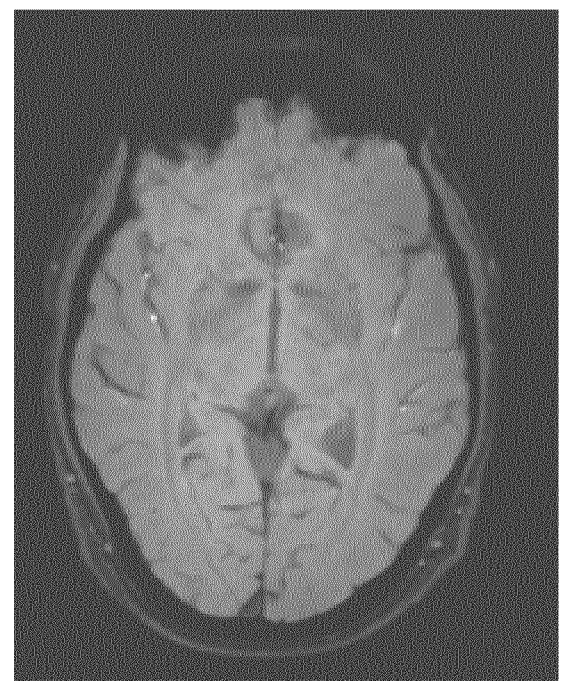
FIG. 12 shows a corrected MRI image using the same data as FIG. 11.

FIG. 12 shows a corrected image based on the same data at the same echo-time (20 ms) using the method described in steps 1 through 10 above. Dephasing is reduced close to the nasal sinus.

In the above equations, the off resonance terms is represented by two terms $e^{i\gamma t_j \Delta B(r)}$ and $e^{i\gamma t_j \Delta B'(r)}$. However, the above algorithm can easily be modified such that the B' and $\Delta B$ terms are replaced with a single term that represents the entire off-resonance field.

While the invention has been illustrated and described in detail in the drawings and foregoing description, such illustration and description are to be considered illustrative or exemplary and not restrictive; the invention is not limited to the disclosed embodiments.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measured cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

LIST OF REFERENCE NUMERALS 100 medical system
102 computer
104 processor
106 hardware interface
108 user interface
110 memory
120 machine executable instructions
122 measured gradient echo k-space data
124 off-resonance phase map
126 initial image
128 upsampled phase map
130 upsampled image
132 modulated image
134 corrected image
136 updated k-space data
138 data consistency algorithm
140 k-space representation
142 updated image
144 smoothing algorithm
200 receive measured gradient echo k-space data
202 receive an off-resonance phase map
204 reconstruct an initial image from the measured gradient echo k-space data
206 calculate an upsampled phase map from the off-resonance phase map
208 calculate an upsampled image from the initial image
210 calculating a modulated image by modulating the upsampled image with the upsampled phase map
212 calculate a corrected image comprising iteratively
214 calculating updated k-space data by applying a data consistency algorithm to a k-space representation of the modulated image and the measured gradient echo k-space data
216 calculating an updated image from the updated k-space data
218 iterations finished
220 end
300 medical system
302 magnetic resonance imaging system
304 magnet
306 bore of magnet
308 imaging zone
309 region of interest
310 magnetic field gradient coils
312 magnetic field gradient coil power supply
314 radio-frequency coil
316 transceiver
318 subject
320 subject support
330 pulse sequence commands
400 control the magnetic resonance imaging system with the pulse sequence commands to acquire the measured gradient echo k-space data

The invention claimed is:

1. A medical system comprising:
a memory configured to store machine executable instructions;
a processor configured to control the medical system, wherein execution of the machine executable instructions causes the processor to:
receive measured gradient echo k-space data;
receive an off-resonance phase map;
reconstruct an initial image from the measured gradient echo k-space data;
calculate an upsampled phase map from the off-resonance phase map;
calculate an upsampled image from the initial image;
calculating a modulated image by modulating the upsampled image with the upsampled phase map;
calculate a corrected image comprising iteratively:
calculating updated k-space data by applying a data consistency algorithm to a k-space representation of the modulated image and the measured gradient echo k-space data; and
calculating an updated image from the updated k-space data, wherein calculation of the updated image comprises demodulation by the upsampled phase map, wherein calculating the updated image further comprises applying a smoothing algorithm, wherein the modulated image for further iteration results from the updated image.

2. The medical system of claim 1, wherein the step of calculating a modulated image by modulating the upsampled image by the upsampled phase map is performed iteratively during the iterative calculation of the corrected image, wherein the calculation of the updated image from the updated k-space data comprises:
  calculating an intermediate image from the updated k-space data,
  calculating a demodulated image by demodulating the intermediate image with the upsampled phase map; and
  calculating the updated image from the demodulated image, wherein the updated image is either output as the corrected image or used as the upsampled image in a further iteration.

3. The medical system of claim 2, wherein the smoothing algorithm comprises a spatial smoothing filter configured for smoothing the demodulated image.

4. The medical system of claim 2, wherein the updated image is calculated comprising:
  calculating demodulated k-space data from the demodulated image,
  calculating the updated image by applying a k-space mask to the demodulated k-space data and applying a de-ringing filter to the demodulated k-space data.

5. The medical system of claim 2, wherein the data consistency algorithm is configured to calculate the updated k-space data using a fitting of the k-space representation of the modulated image to the measured gradient echo k-space data or replacing a portion of the k-space representation of the modulated image with the measured gradient echo k-space data.

6. The medical system of claim 1, wherein the updated k-space data results from a calculation of a residual between a projection of the modulated image into Fourier space and the measured gradient echo k-space data, wherein calculating the updated image from the updated k-space data comprises:
  calculate a residual image by transforming the residual to image space,
  calculate a demodulated residual image by demodulating the residual image with the upsampled phase map, and
  updating the modulated image with the demodulated residual image.

7. The medical system of claim 6, wherein the smoothing algorithm is a regularization term applied during the updating of the modulated image with the demodulated residual image.

8. The medical system of claim 6, wherein the corrected image is provided by down sampling the modulated image after completion of the iterations.

9. The medical system of claim 1, wherein the measured gradient echo k-space data is parallel imaging magnetic resonance imaging data acquired according to a parallel imaging magnetic resonance imaging protocol from multiple antenna elements, wherein the initial image is reconstructed according to the parallel magnetic resonance imaging protocol, and wherein the data consistency algorithm is configured to modify the k-space representation of the modulated image with the measured gradient echo k-space data from each of the multiple antenna elements collectively.

10. The medical system of claim 1, wherein the measured gradient echo k-space data is received for one or more gradient echoes,
  wherein the initial image is an initial magnetization image, wherein the initial magnetization image is reconstructed for each of the one or more gradient echoes from the measured gradient echo k-space data, wherein the upsampled image is an upsampled magnetization image, wherein the upsampled magnetization image is calculated for each of the one or more gradient echoes from the initial magnetization image for each of the one or more gradient echoes, wherein the modulated image is calculated for each of the one or more gradient echoes by modulating the upsampled image for each of the one or more gradient echoes with the upsampled phase map; wherein the corrected image for each of the one or more gradient echoes is calculated iteratively, wherein the updated k-space data is calculated by applying the data consistency algorithm to the k-space representation of the modulated image for each of the one or more gradient echoes and the measured gradient echo k-space data, wherein the update image is calculated for each of the one or more gradient echoes from the updated k-space data.

11. The medical system of claim 1, wherein the initial image is calculated using a signal model dependent upon one or more parameter mappings, and wherein iterative calculation of the corrected image comprises updating the parameter mappings.

12. The medical system of claim 1, wherein the signal model is any one of the following: a Dixon model, an R2* mapping, and a parameter mapping model.

13. The medical system of claim 1, wherein the medical system further comprises a magnetic resonance imaging system, wherein the memory further contains pulse sequence commands configured for controlling the magnetic resonance imaging system to acquire the measured gradient echo k-space data according to a gradient echo magnetic resonance imaging protocol, wherein execution of the machine executable instructions further causes the processor to control the magnetic resonance imaging system with the pulse sequence commands to acquire the measured gradient echo k-space data.

14. A computer program comprising machine executable instructions for execution by a processor controlling a medical system, wherein execution of the machine executable instructions causes the processor to:
  receive measured gradient echo k-space data;
  receive an off-resonance phase map;
  reconstruct an initial image from the measured gradient echo k-space data;
  calculate an upsampled phase map from the off-resonance phase map;
  calculate an upsampled image from the initial image;
  calculating a modulated image by modulating the upsampled image with the upsampled phase map;
  calculate a corrected image comprising iteratively:
    calculating updated k-space data by applying a data consistency algorithm to a k-space representation of the modulated image and the measured gradient echo k-space data; and
    calculating an updated image from the updated k-space data, wherein calculation of the updated image comprises demodulation by the upsampled phase map wherein calculating the updated image further comprises applying a smoothing algorithm, wherein the modulated image for further iteration results from the updated image.

15. A method of operating a medical system, wherein the method comprises,
  receiving measured gradient echo k-space data;
  receiving an off-resonance phase map;

reconstructing an initial image from the measured gradient echo k-space data;
calculating an upsampled phase map from the off-resonance phase map;
calculating an upsampled image from the initial image;
calculating a modulated image by modulating the upsampled image with the upsampled phase map;
calculating a corrected image comprising iteratively:
  calculating updated k-space data by applying a data consistency algorithm to a k-space representation of the modulated image and the measured gradient echo k-space data; and
  calculating an updated image from the updated k-space data, wherein calculation of the updated image comprises demodulation by the upsampled phase map wherein calculating the updated image further comprises applying a smoothing algorithm, wherein the modulated image for further iteration results from the updated image.

* * * * *